(12) United States Patent
Sun et al.

(10) Patent No.: US 7,932,104 B2
(45) Date of Patent: Apr. 26, 2011

(54) METHOD FOR INSPECTING PHOTORESIST PATTERN

(75) Inventors: Chia-Chen Sun, Kaohsiung (TW); Yi-Chung Sheng, Tainan (TW); Sheng-Yuan Hsueh, Tai-Nan (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/468,063

(22) Filed: May 19, 2009

(65) Prior Publication Data

US 2010/0297791 A1    Nov. 25, 2010

(51) Int. Cl.
*G01R 31/26*    (2006.01)

(52) U.S. Cl. ........ 438/14; 438/17; 438/689; 257/E21.53

(58) Field of Classification Search ............ 438/14, 438/17, 689, 706, 717; 257/E21.53
See application file for complete search history.

(56) References Cited

U.S. PATENT DOCUMENTS

| | | | | |
|---|---|---|---|---|
| 6,127,237 A | * | 10/2000 | Tsuchiaki | 438/381 |
| 6,784,520 B2 | * | 8/2004 | Doi | 257/603 |
| 2005/0026047 A1 | * | 2/2005 | Yang | 430/5 |

* cited by examiner

*Primary Examiner* — Hsien-ming Lee
(74) *Attorney, Agent, or Firm* — Winston Hsu; Scott Margo

(57) ABSTRACT

A method for inspecting a photoresist pattern is disclosed. First, a substrate with a first doping region is provided. Then, a photoresist is formed to cover the substrate. Later, the photoresist is patterned to form a photoresist pattern. Afterwards, the substrate is doped by using the photoresist pattern, and a PN junction exists in the first doping region. Thereafter, a current passing through the PN junction is tested to inspect the photoresist pattern.

15 Claims, 8 Drawing Sheets

METHOD FOR INSPECTING PHOTORESIST PATTERN

BACKGROUND OF THE INVENTION

1. Field of the Invention

The present invention relates to a method for inspecting a photoresist pattern. In particular, the present invention relates to a method for inspecting a photoresist pattern by measuring the current of a PN junction.

2. Description of the Prior Art

In regular standard semiconductor processes, an ion implantation procedure is often used to adjust the conductivity types of the materials, to define certain specific regions and to construct the needed elements. The procedures to operate the ion implantation usually first involve using a mask, a patterned photoresist for example, to expose the region which needs the ion implantation and to mask the region which does not need the ion implantation. Later, suiChart dopants are used and proper energy range is determined to construct the doped regions with expected concentrations and depth followed by suiChart thermal activation.

Generally speaking, the exposure and development techniques are frequently used in patterning the photoresist to transfer the pre-determined pattern on the reticles onto the photoresist. With the progressive trend of shrinkage of the critical dimension (CD), the off-set issue between the photoresist pattern to be formed and the existing pattern on the substrate is getting more and more serious since the dopants may not be formed on the expected regions correctly or completely. Moreover, the patterned photoresist may cause the regions to be implanted overly large, overly small, closed or distorted due to various reasons, such as exposure failure or incomplete development, during the exposure and development procedures. No matter what the cause is, any one of them would eventually compromise the usage and operation of the final semiconductor.

There are two known methods which are currently employed to inspect the minimum regions and the enclosure regions of the doped layer photoresist in the standard logic process. The first one is called "DOF simulation tool." In this method, the DOF simulation tool is used to predict the minimum regions and the enclosure regions of the doped layer photoresist in the standard logic process. Because the DOF simulation tool does not predict the minimum regions and the enclosure regions of the doped layer photoresist in the standard logic process in accordance with the data obtained following the ion implantation procedure, judged by the empirical viewpoint, the predicted results by the DOF simulation tool are more often than not too ideal to practically reflect the actual status of the regions on the doped layer photoresist.

The other method is called "In Line Data Check." The bottom scum or top rounding of the photoresist is "hand-picked" by naked eyes along with proper apparatuses. Apparently, any inspection judged by naked eyes is too difficult and too subjective. Second, this method only "physically" inspects the physical shape of the photoresist, which fails to practically reflect the actual status of the regions on the doped layer photoresist, either.

Accordingly, a novel method for inspecting a photoresist pattern is still needed to obtain the first-hand information regarding the actual status of the minimum regions and the enclosure regions of the doped layer photoresist in the standard logic process. This novel method should not be too ideal to practically reflect the actual status of the minimum regions and the enclosure regions of the doped layer photoresist in the standard logic process.

SUMMARY OF THE INVENTION

In view of the above technical blind spot, the present invention proposes a novel method for inspecting a photoresist pattern. The method of the present invention is capable of conveying the first-hand information regarding the actual status of the minimum regions and the enclosure regions of the doped layer photoresist in the standard logic process without being too ideal or being only physical.

The present invention therefore proposes a method for inspecting a photoresist pattern. First, a substrate with a first doping region is provided. Then, a photoresist is formed to cover the substrate. Later, the photoresist is patterned to form a photoresist pattern. Afterwards, the substrate is doped by using the photoresist pattern, and a PN junction exists in the first doping region. Thereafter, a current passing through the PN junction is tested to inspect the photoresist pattern.

In one aspect of the present invention, the photoresist pattern exposes the first doping region, so that the doping procedure forms a second doping region, and the first doping region and the second doping region together form the PN junction.

In another aspect of the present invention, the photoresist pattern covers the first doping region and the substrate further includes an original doping region so that the first doping region and the original doping region together form the PN junction.

In yet another aspect of the present invention, the method may involve repeatedly measuring the current of the PN junction to construct a database after changing the size of the photoresist pattern. Afterwards, if a sample including an unknown PN junction defined by a given patterned photoresist is provided, the current of the unknown PN junction is measured to obtain a measured value and to map the measured value with the database so as to understand the actual status of the PN junction, such as the minimum regions and/or the enclosure regions of the doped layer photoresist in the standard logic process.

Because the method of the present invention measures the current of the PN junction defined by a photoresist pattern as a guide and the current of the PN junction is directly related to the status of the regions done by an ion implantation procedure, the method of the present invention can practically obtain the first-hand information regarding the actual status of the minimum regions and/or the enclosure regions of the doped layer photoresist in the standard logic process without being too ideal or being only physical.

These and other objectives of the present invention will no doubt become obvious to those of ordinary skill in the art after reading the following detailed description of the preferred embodiment that is illustrated in the various figures and drawings.

DETAILED DESCRIPTION

The method of the present invention inspects the correctness of a photoresist pattern through measuring the current of a PN junction defined by the photoresist pattern as a guide. FIGS. 1-6A illustrate various preferred embodiments of inspecting a photoresist pattern of the method of the present invention. First, please refer to FIG. 1, a substrate 101 is provided. The substrate 101 includes a first doping region 111. The first doping region 111 may be an N-type doping region or a P-type doping region. The substrate 101 may be a dummy wafer, a test wafer or a product wafer. The first doping region 111 is located in one of the test keys thereon. Optionally, the first doping region 111 may be a surrounded doping region. For example, the first doping region 111 may be surrounded by a shallow trench isolation 102.

Figure 1:
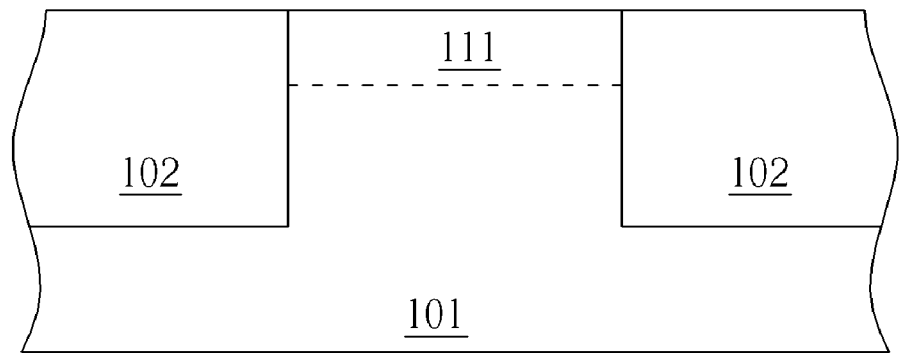
FIGS. 1-6A illustrate various preferred embodiments of inspecting a photoresist pattern of the method of the present invention.
Figure 2:
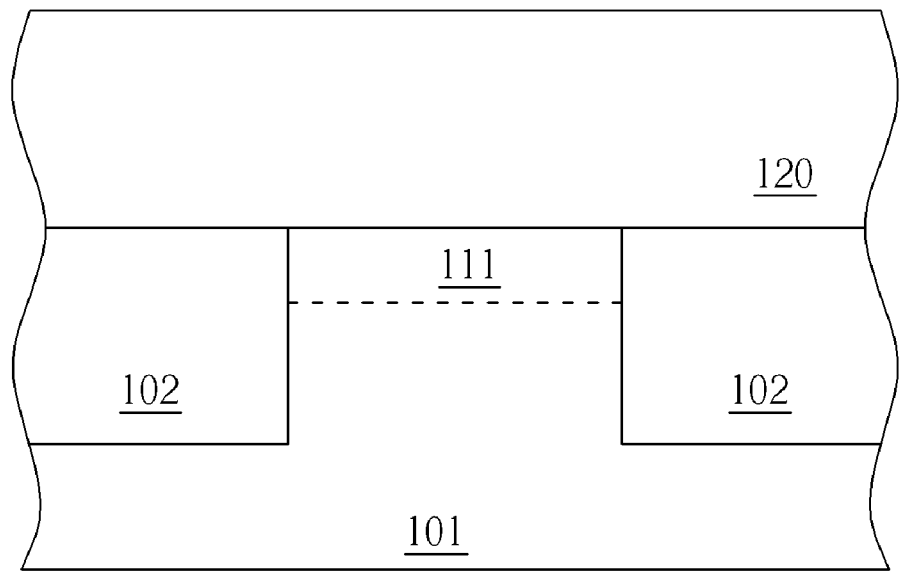

Second, please refer to FIG. 2, a photoresist 120 is formed to cover the substrate 101. Then, please refer to FIG. 3, the photoresist 120 is patterned, for example by conventional exposure and development procedures, to define a photoresist pattern 121 in the photoresist 120.

Figure 3:
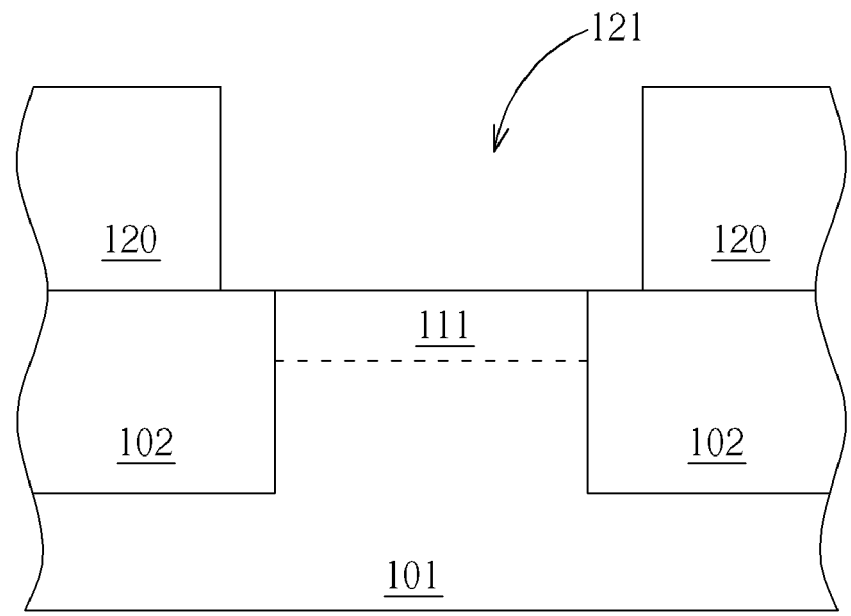
Figure 3A:
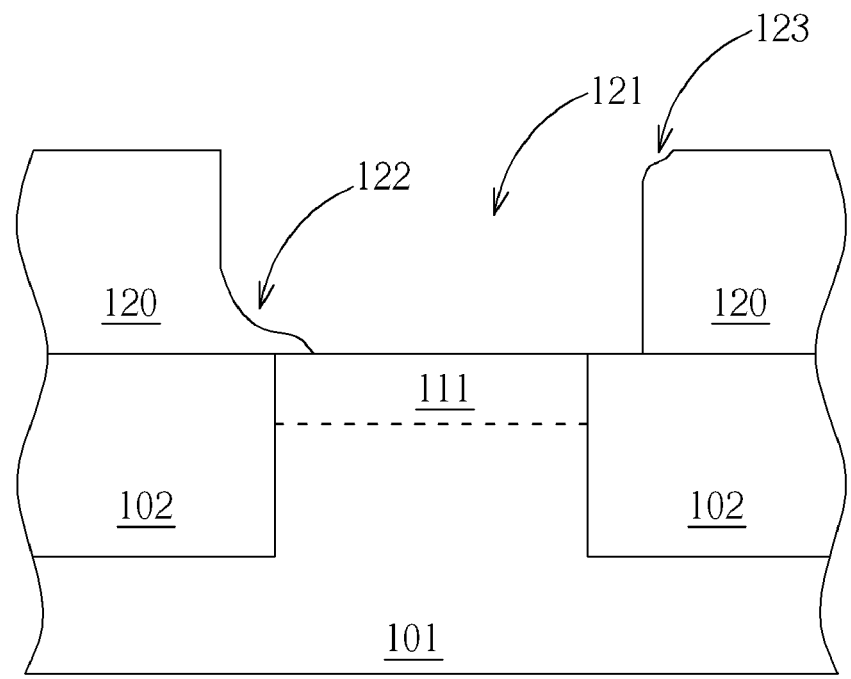
Figure 3B:
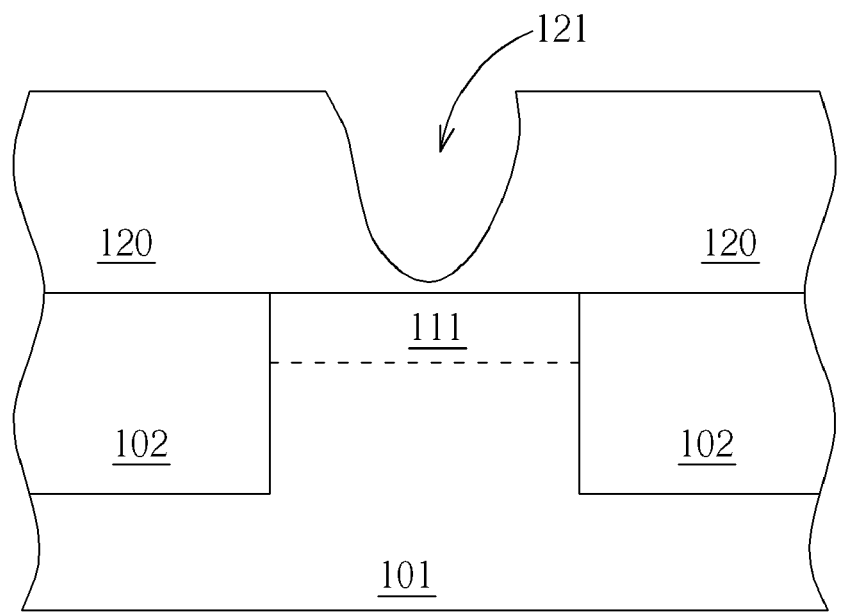

After the above conventional exposure and development procedures, due to different process capabilities, there may be bottom scum 122 or top rounding 123 present, as shown in FIG. 3A, so that the physical shape of the photoresist pattern 121 fails to meet the expectations and jeopardizes the distribution of dopants by the following ion implantation procedure. However, such defects may be too vague to be noticed by naked eyes, or even with sophisticated apparatuses. Even more, the failed photoresist pattern 121 forms an enclosure region as shown in FIG. 3B.

In a first preferred embodiment of the present invention, the photoresist pattern 121 exposes the first doping region 111, as shown in FIG. 3. For example, the photoresist pattern 121 should completely expose the first doping region 111. Later, please refer to FIG. 4, the photoresist pattern 121 is used as a mask to perform an ion implantation procedure on the substrate 101. Accordingly, the ion implantation procedure forms a second doping region 112. The present invention employs the dopants which are different from those employed in the first doping region 111 in conductivity type to form the second doping region 112, so the second doping region 112 may be a P-type doping region or an N-type doping region. Now, the first doping region 111 and the second doping region 112 together should form a PN junction 113.

When the first doping region 111 is located in a test key, the PN junction 113 is located in the same test key, too. Besides, when the first doping region 111 is surrounded by a shallow trench isolation 102, the PN junction 113 is surrounded by the shallow trench isolation 102, too. Afterwards, the current of the PN junction 113 is measured as a guide to understand the actual status of the photoresist pattern 121.

Figure 4:
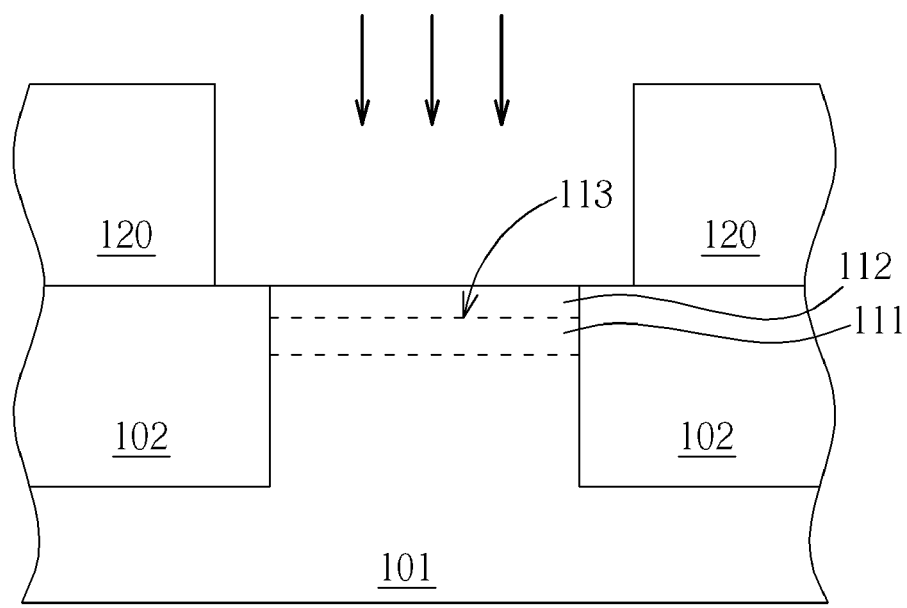

For example, in an ideal condition, the photoresist pattern 121 should completely expose the first doping region 111, so the ion implantation procedure forms a second doping region 112 which is entirely covering the first doping region 111, as shown in FIG. 4. The second doping region 112 which is entirely covering the first doping region 111 forms a good PN junction 113 with the first doping region 111. If a well-formed PN junction 113 is measured, an extremely low current should be detected. In other words, if an extremely low current is picked up from the PN junction 113, the photoresist pattern 121 subject to inspection is considered to be "correct and accurate."

Figure 4A:
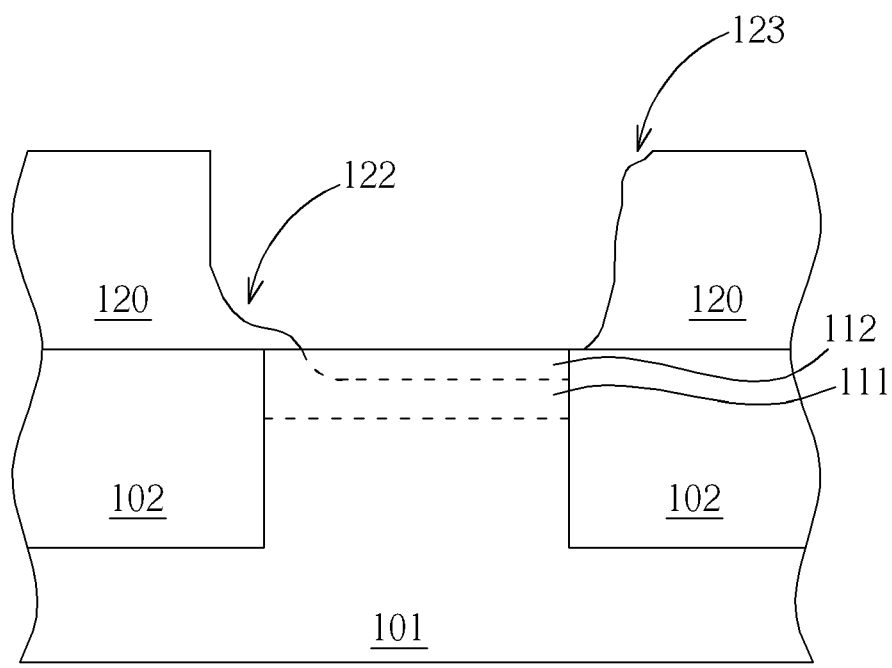

However, in the current practice, due to possible bottom scum 122 and/or top rounding 123 or, even the enclosure region 121 caused by failed photoresist pattern 121 being present in the photoresist 120, the photoresist pattern 121 may not completely expose the first doping region 111 as expected. Therefore, the ion implantation procedure may form a second doping region 112 which only partially covers the first doping region 111, as shown in FIG. 4A. The second doping region 112 not able to completely cover the first doping region 111 would form a flawed PN junction 113. Or, even a photoresist pattern 121 of an enclosure region, as shown in FIG. 3B, is formed so that the second doping region 112 is not formed at all, further the PN junction 113 is not formed at all. If a flawed PN junction 113 is measured (a current picked up from a later formed contact plug), an excessively high leak current or no current at all may be measured. In other words, if an excessively high leak current or no current at all is measured, the photoresist pattern to be inspected is considered "flawed."

Figure 10:
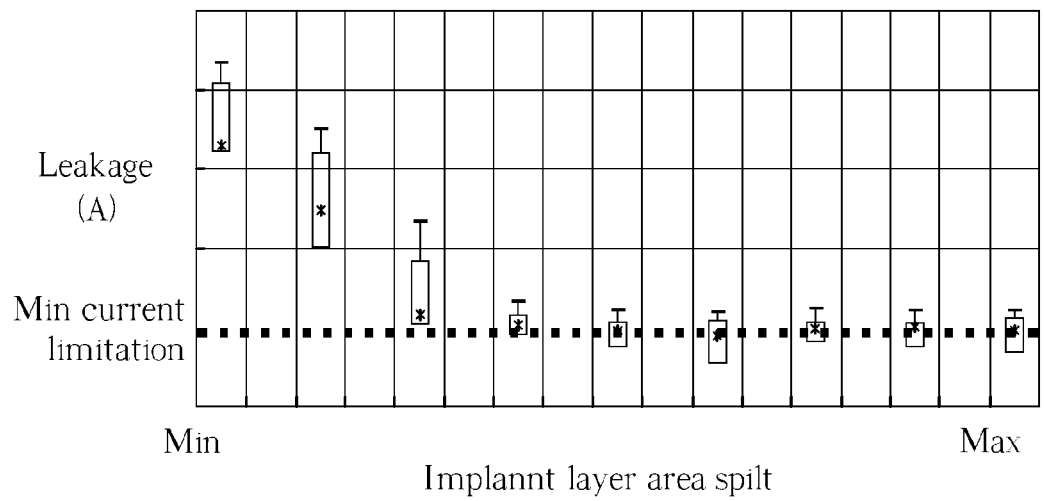
FIG. 10 shows the leakage currents vs. different split sizes of the photoresist pattern.

In the light of the above descriptions, persons of ordinary skills in the art may comprehend that, by measuring the current of the PN junction 113 as a guide, the quality of the open regions in the photoresist pattern may be concluded. FIG. 10 shows the leakage currents vs. different split sizes of the photoresist pattern. It is concluded from FIG. 10 that the lowest leakage currents form a minimum value group, usually disposed in the range of greater splits because it is easier to expose and to develop a larger split and a photoresist pattern of better quality is therefore more easily obtained.

Figure 5:
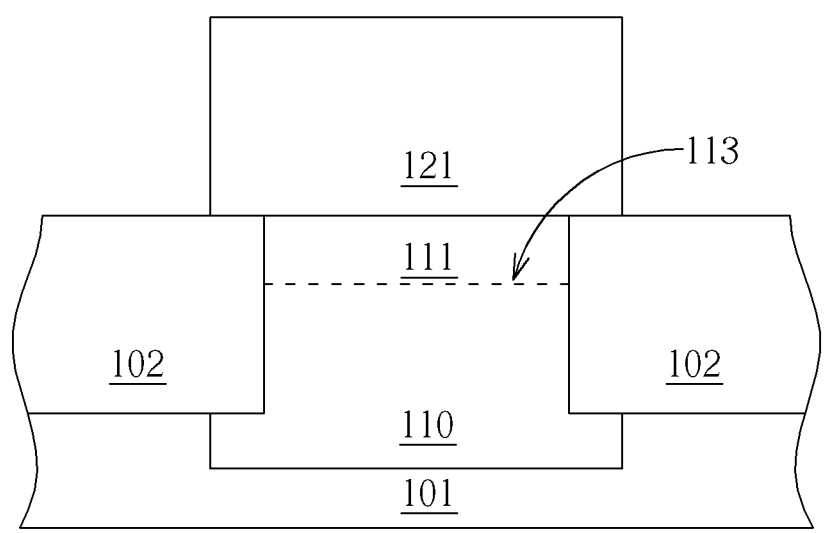

In a second preferred embodiment of the present invention, the photoresist pattern 121 of an enclosure region covers the first doping region 111, as shown in FIG. 5. In such a way, the substrate 101 includes an original doping region 110 to be formed in advance. The original doping region 110 and the first doping region 111 use different dopants respectively so that the original doping region 110 and the first doping region 111 together form a PN junction 113. When the first doping region 111 is located in a test key, the PN junction 113 is located in the same test key, too. Besides, when the first doping region 111 is surrounded by a shallow trench isolation 102, the PN junction 113 is also surrounded by the shallow trench isolation 102. Afterwards, the current of the PN junction 113 is measured as a guide to understand the actual status of the photoresist pattern 121.

Figure 6:
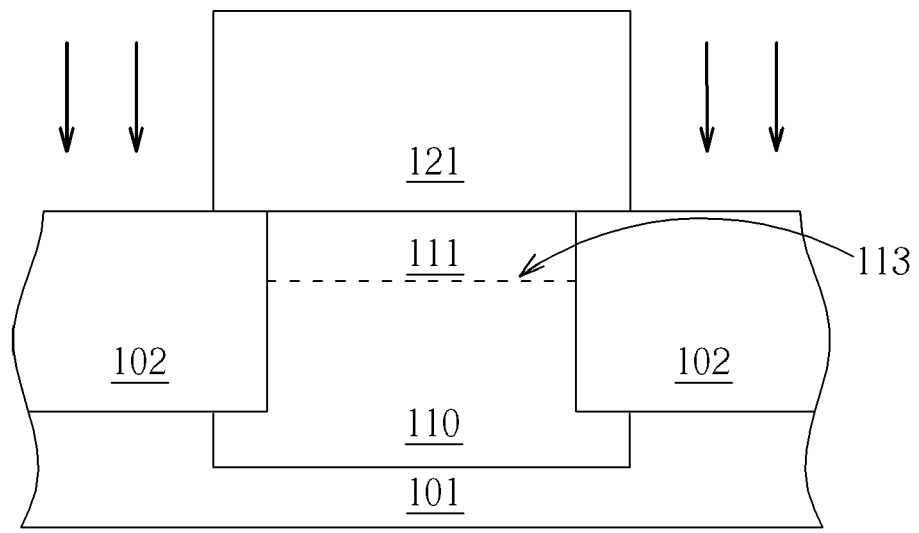

For example, in an ideal condition, the photoresist pattern 121 should completely cover the first doping region 111, so the ion implantation procedure cannot damage the first doping region 111 at all in the presence of the shielding of the photoresist pattern 121. In other words, the ion implantation procedure cannot damage the PN junction 113 at all, as shown in FIG. 6. Because the ion implantation procedure cannot damage the first doping region 111 at all in the presence of the shielding of the photoresist pattern 121, the PN junction 113 remains intact after the ion implantation procedure. If a complete and intact PN junction 113 is measured, an extremely low current should be detected. In other words, if an extremely low current is picked up from the PN junction 113, the photoresist pattern 121 subject to inspection is considered to be "correct and accurate."

Figure 6A:
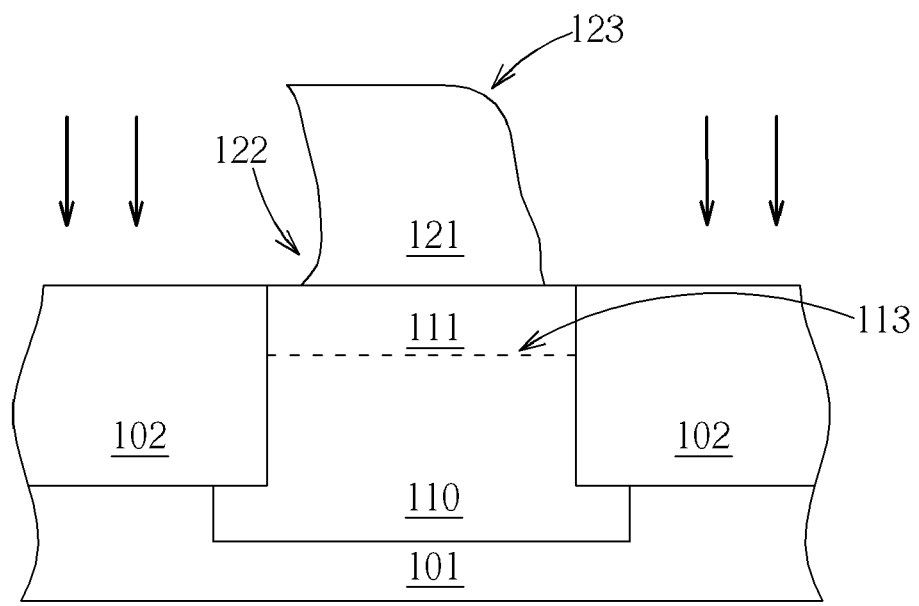

However, in the current practice, due to possible off-sets of the photoresist pattern 121, bottom scum 122 and/or top rounding 123, the photoresist pattern 121 may not completely cover/shield the first doping region 111 as expected. Therefore, the ion implantation procedure may damage the first doping region 111, i.e. damage the PN junction 113, as shown in FIG. 6A. If a damaged PN junction 113 is measured (a current picked up from a later formed contact plug), an excessively high leak current is measured. In other words, if an excessively high leak current is measured, the photoresist pattern of an enclosure region to be inspected is considered "flawed".

Figure 11:
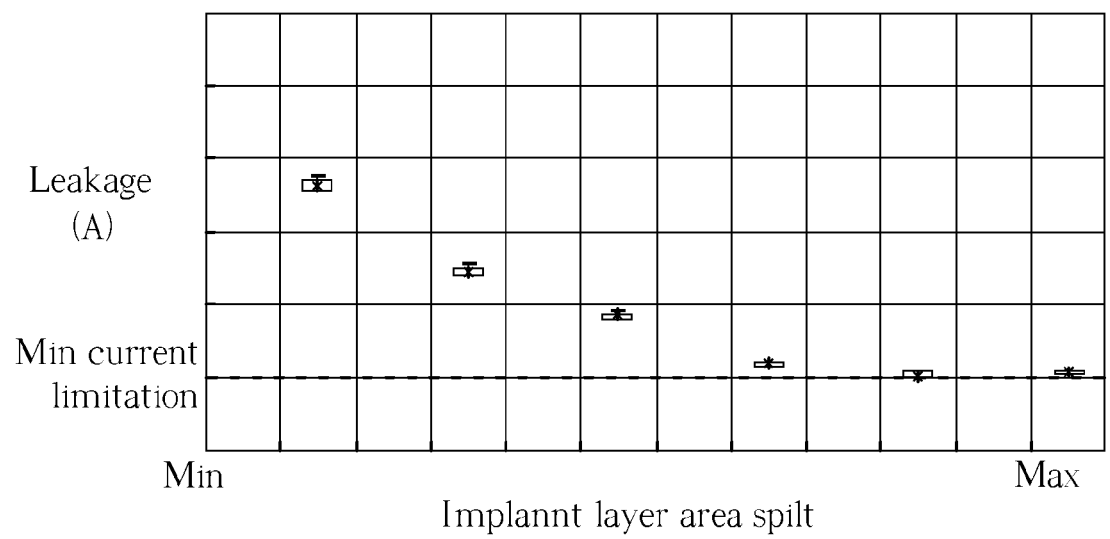
FIG. 11 shows the leakage currents vs. different sizes of the photoresist pattern.

In the light of the above descriptions, persons of ordinary skills in the art may comprehend that, by measuring the current of the PN junction 113 as a guide, the quality of the photoresist pattern may be concluded, whatsoever the photoresist pattern 121 exposes the first doping region 111 or covers the first doping region 111. FIG. 11 shows the leakage currents vs. different sizes of the photoresist pattern. It is concluded from FIG. 11 that the lowest leakage currents form a minimum value group, usually disposed in the range of greater photoresist pattern scales because it is easier for the photoresist pattern of larger sizes to accurately cover the first doping region 111 or to be exposed or developed correctly so a photoresist pattern of better quality is therefore more easily obtained, moreover, to correctly inspect a photoresist pattern of an open region or of an enclosure region.

FIG. 10 and FIG. 11 show the leakage currents vs. different sizes of the photoresist pattern. In other words, no matter whether the embodiment of the photoresist pattern 121 exposes the first doping region 111 or covers the first doping region 111, a database representing the profile of photoresist pattern may be formed as long as the size of the photoresist pattern is changed to measure the corresponding various currents of the PN junction 113.

With the database representing the profile of photoresist pattern at hand, it may be useful in speculating the profile and the quality of a sample including an unknown patterned photoresist. For example, a sample including a feature defined by a patterned photoresist is provided. Such feature may be an unknown PN junction.

Next, a current of the unknown PN junction is measured to obtain a measured value. Now, the measured value may be compared with the database. The comparison results may be helpful in determining the profile and the quality of the unknown PN junction. For example, in one aspect, if a leak current which is low enough is measured, the unknown photoresist pattern subject to inspection is considered to be "correct and accurate." In another aspect, if a leak current deviating too much from a min. value or no leak current is measured, the unknown photoresist pattern subject to inspection is considered flawed. Moreover a method to correctly inspect a photoresist pattern of an open region or of an enclosure region accordingly is constructed.

Figure 7:
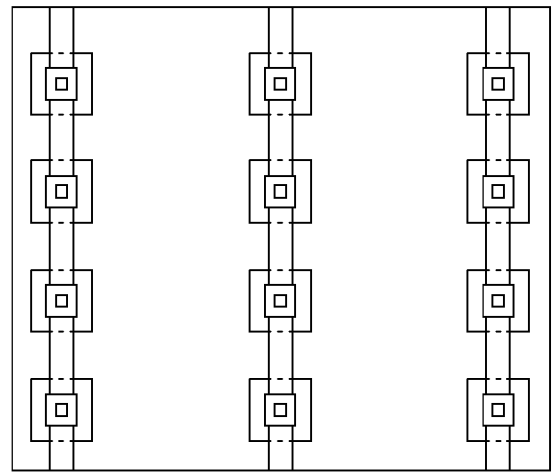
FIGS. 7-8 illustrate various layout patterns of the photoresist pattern of the present invention on the test key.
Figure 8:
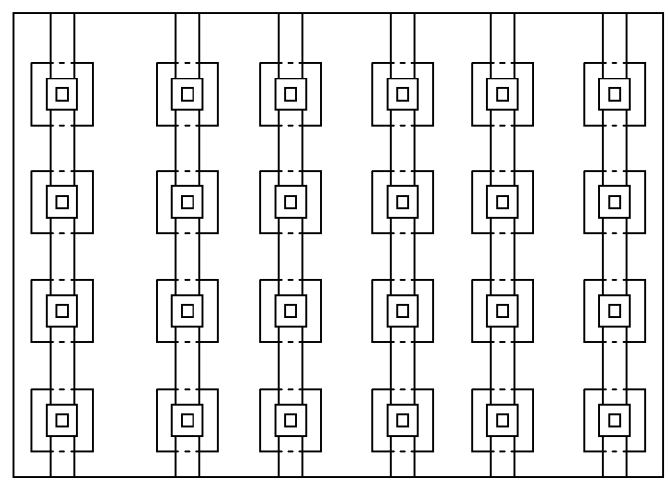

The photoresist pattern of the present invention may have various layout patterns. FIGS. 7-8 illustrate various layout patterns of the photoresist pattern of the present invention on the test key. As shown in FIG. 7, the photoresist pattern of the present invention on the test key may be an isolation (iso) pattern. In the iso pattern, the photoresist pattern is pretty much scattered, i.e. a substantial long distance lies between the photoresist pattern. Alternatively, as shown in FIG. 8, the photoresist pattern of the present invention on the test key may be a dense pattern. In the dense pattern, the photoresist pattern is pretty much closer to one another, i.e. a shorter distance lies between the photoresist pattern. The method of the present invention may inspect a photoresist pattern of iso type or a dense type.

Figure 9:
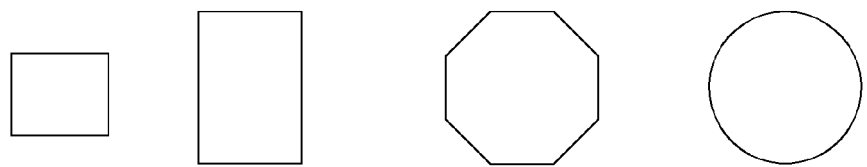
FIG. 9 illustrates various geometric figures of the photoresist pattern of the present invention.

The photoresist pattern of the present invention may have various geometric figures. FIG. 9 illustrates various geometric figures of the photoresist pattern of the present invention. As shown in FIG. 9, in a first example, the photoresist pattern of the present invention is rectangular, for example a square or an oblong. Or in a second example, the photoresist pattern of the present invention is octagonal, for example an octagon.

Alternatively, in a third example, the photoresist pattern of the present invention is round, for example a circle. The photoresist pattern of the present invention may also be the combination of the above geometric figures.

The method for inspecting a photoresist pattern by measuring the current of the PN junction may have many applications. For example, the original doping region, the first doping region and the second doping region may be any part of an element including a PN junction, such as a lateral PN junction or a bipolar junction transistor (BJT). Furthermore, the method for inspecting a photoresist pattern may be used in various ion implantation procedures, such as P-well, N-well, LDD, pocket implant, HV, MV, LV, P-type poly Si, N-type poly Si, bit line or word line in a memory unit, contact image sensor (CIS) or p-intrinsic-n Diode (PIN) as long as a doping region is present.

The method for inspecting a photoresist pattern uses a counter-dopant to test the integrity of a given PN junction by measuring the current of the PN junction to faithfully reflect the profile and the quality of a sample including an unknown patterned photoresist. Because the method of the present invention measures the current of the PN junction defined by a photoresist pattern as a guide and the current of the PN junction is directly related to the status of the regions done by an ion implantation procedure, the method of the present invention can practically obtain the first-hand information regarding the actual status of the minimum regions and the enclosure regions of the doped layer photoresist in the standard logic process without being too ideal or being just too physical.

Those skilled in the art will readily observe that numerous modifications and alterations of the device and method may be made while retaining the teachings of the invention.

What is claimed is:

1. A method for inspecting a photoresist pattern, comprising:
   providing a substrate with a first doping region;
   forming a photoresist to cover said substrate;
   patterning said photoresist to form a photoresist pattern;
   doping said substrate by using said photoresist pattern as a mask, wherein a PN junction exists in said first doping region; and
   passing a current through said PN junction to inspect said photoresist pattern;
   changing a size of said photoresist pattern; and
   repeatedly measuring said current of said PN junction.

2. The method of claim 1, wherein said PN junction is disposed in a test key.

3. The method of claim 1, wherein said PN junction is surrounded by a shallow trench isolation.

4. The method of claim 1, wherein said photoresist pattern exposes said first doping region.

5. The method of claim 4, wherein doping said substrate forms a second doping region so that said first doping region and said second doping region together form said PN junction.

6. The method of claim 1, wherein said photoresist pattern covers said first doping region.

7. The method of claim 6, wherein said substrate further comprises an original doping region so that said first doping region and said original doping region together forms said PN junction.

8. The method of claim 1, wherein patterning said photoresist comprises forming a patterned photoresist of various sizes.

9. The method of claim 1, further comprising:
constructing a database by repeatedly measuring said current of said PN junction.

10. The method of claim 9, further comprising:
providing a sample comprising a unknown PN junction defined by a given patterned photoresist;
measuring a current of said unknown PN junction to obtain a measured value; and
mapping said measured value with said database.

11. The method of claim 1, wherein said photoresist pattern forms an isolation pattern.

12. The method of claim 1, wherein said photoresist pattern is rectangular.

13. The method of claim 1, wherein said photoresist pattern is round.

14. The method of claim 1, wherein said photoresist pattern is octagonal.

15. The method of claim 1, wherein said first doping region and said second doping region together form a bipolar junction transistor.

* * * * *